US008018016B2

(12) United States Patent
McCarten et al.

(10) Patent No.: US 8,018,016 B2
(45) Date of Patent: *Sep. 13, 2011

(54) BACK-ILLUMINATED IMAGE SENSORS HAVING BOTH FRONTSIDE AND BACKSIDE PHOTODETECTORS

(75) Inventors: John P. McCarten, Penfield, NY (US); Cristian A. Tivarus, Rochester, NY (US); Joseph R. Summa, Hilton, NY (US); Eric G. Stevens, Webster, NY (US); Hung Q. Doan, Rochester, NY (US); Robert M. Guidash, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/492,460

(22) Filed: Jun. 26, 2009

(65) Prior Publication Data
US 2010/0327392 A1 Dec. 30, 2010

(51) Int. Cl.
*H01L 31/101* (2006.01)
(52) U.S. Cl. ........................................ 257/447
(58) Field of Classification Search .................. 257/440, 257/447, 432–433, E31.113
See application file for complete search history.

(56) References Cited

U.S. PATENT DOCUMENTS

| 6,921,934 | B2 | 7/2005 | Patrick |
| 6,933,489 | B2 * | 8/2005 | Fujii et al. .................. 250/214.1 |
| 7,160,753 | B2 * | 1/2007 | Williams, Jr. .................. 438/73 |
| 7,256,764 | B2 * | 8/2007 | Izumi ............................. 345/104 |
| 7,265,397 | B1 * | 9/2007 | Tower et al. .................. 257/223 |
| 7,495,273 | B2 | 2/2009 | Patrick |
| 7,701,028 | B2 * | 4/2010 | Kaufmann et al. ........... 257/458 |
| 2008/0036022 | A1 * | 2/2008 | Hwang et al. .................. 257/432 |
| 2009/0121307 | A1 | 5/2009 | Tennant |
| 2009/0184387 | A1 * | 7/2009 | Takeuchi ....................... 257/440 |
| 2009/0189234 | A1 | 7/2009 | Mabuchi |
| 2009/0218621 | A1 * | 9/2009 | Pfirsch et al. ................. 257/342 |
| 2010/0116971 | A1 * | 5/2010 | McCarten et al. .......... 250/214.1 |
| 2010/0144084 | A1 * | 6/2010 | Doan et al. ....................... 438/72 |
| 2010/0148289 | A1 * | 6/2010 | McCarten et al. ............. 257/432 |

FOREIGN PATENT DOCUMENTS

| CN | 101 312 204 A | 11/2008 |
| EP | 1 995 783 A2 | 11/2008 |

* cited by examiner

*Primary Examiner* — Nathan W Ha
(74) *Attorney, Agent, or Firm* — Blakely Sokoloff Taylor & Zafman LLP

(57) ABSTRACT

A back-illuminated image sensor includes a sensor layer of a first conductivity type having a frontside and a backside opposite the frontside. An insulating layer is disposed over the backside. A circuit layer is formed adjacent to the frontside such that the sensor layer is positioned between the circuit layer and the insulating layer. One or more frontside regions of a second conductivity type are formed in at least a portion of the frontside of the sensor layer. A backside region of the second conductivity type is formed in the backside of the sensor layer. A plurality of frontside photodetectors of the first conductivity type is disposed in the sensor layer. A distinct plurality of backside photodetectors of the first conductivity type separate from the plurality of frontside photodetectors is formed in the sensor layer contiguous to portions of the backside region of the second conductivity type.

6 Claims, 14 Drawing Sheets

BACK-ILLUMINATED IMAGE SENSORS HAVING BOTH FRONTSIDE AND BACKSIDE PHOTODETECTORS

CROSS REFERENCE TO RELATED APPLICATIONS

This application is related to U.S. patent application Ser. No. 12/459,144 filed on Jun. 26, 2009, U.S. patent application Ser. No. 12/459,044 filed on Jun. 26, 2009, and U.S. patent application Ser. No. 12/459,121 filed on Jun. 26, 2009.

TECHNICAL FIELD

The present invention relates generally to image sensors for use in digital cameras and other types of image capture devices, and more particularly to back-illuminated image sensors. Still more particularly, the present invention relates to back-illuminated image sensors having frontside and backside photodetectors.

BACKGROUND

An electronic image sensor captures images using light-sensitive photodetectors that convert incident light into electrical signals. Image sensors are generally classified as either front-illuminated image sensors or back-illuminated image sensors. As the image sensor industry migrates to smaller and smaller pixel designs to increase resolution and reduce costs, the benefits of back-illumination become clearer. In front-illuminated image sensors, the electrical control lines or conductors are positioned between the photodetectors and the light-receiving side of the image sensor. The consequence of this positioning is the electrical conductors block part of the light that should be received by the photodetectors, resulting in poor quantum efficiency (QE) performance, especially for small pixels. For back-illuminated image sensors, the electrical control lines or conductors are positioned opposite the light-receiving side of the sensor and do not reduce QE performance.

Back-illuminated image sensors therefore solve the QE performance challenge of small pixel designs. But small pixel designs still have two other performance issues. First, small pixel designs suffer from low photodetector (PD) charge capacity. This is because the first order charge capacity scales along with the area of the photodetector. Second, the process of fabricating a back-illuminated sensor consists of bonding a device wafer to an interposer wafer and then tinning the device wafer. This process produces grid distortions. These grid distortions lead to the misalignments of the color filter array, which increases the amount of pixel-to-pixel color crosstalk.

FIGS. 1(a)-(d) illustrates a method for fabricating a back-illuminated sensor in accordance with the prior art. FIGS. 1(a)-(d) depict a standard Complementary Metal Oxide Semiconductor (CMOS) wafer 100 that includes epitaxial layer 102 disposed on substrate 104. Together, epitaxial layer 102 and substrate 104 form device wafer 106. Alternately, manufacturers can use a silicon-on-insulator (SOI) wafer because the buried insulating layer provides a natural etch stop for the back-thinning of device wafer 106. Regardless of starting material, grid distortion is an issue with the back thinning process.

FIG. 1(b) depicts a finished device wafer 106. Typically, multiple image sensors 108 are fabricated in epitaxial layer 102. FIG. 1(c) illustrates the positioning of an interposer wafer 112 just before bonding. A typical interposer wafer consists of a silicon layer 114 and an adhesive layer 116, such as a CMP silicon dioxide layer. The fabricated device wafer 106 is bonded to the interposer wafer 112, and substrate 104 and a portion of epitaxial layer 102 are removed by first grinding, then polishing, and finally etching the last ten to hundred microns of silicon.

FIG. 1(d) illustrates a finished wafer 118 and an exploded view of a back-illuminated image sensor 108 in accordance with the prior art. Stress accumulates in insulating layer 120 due to the deposition process, and due to the conductive interconnects 122. There are also stresses in the adhesive layers 116, 124. The thinning of device wafer 106 reduces the strength of epitaxial layer 102.

FIG. 2 is an exaggerate distortion pattern due to thinning and stress relaxation of epitaxial layer 102. The dashed line 200 represents the undistorted wafer map of back-illuminated image sensors, while the solid line 202 depicts a final distorted pattern. The distorted pattern 202 is a problem when fabricating color-filter array 126 (see FIG. 1(d)) on a back-thinned image sensor. Almost all lithography equipment measures the alignment mark locations of eight to twelve image sensors 108 on the finished wafer 118, and then performs a global alignment. With modern interferometry techniques, global alignment provides better than ten nanometers (nm) alignment tolerances over three hundred millimeters (mm). In other words, global alignment is superior to die-by-die alignment. Also, blading-off a photolithography mask and aligning the mask on a die-by-die basis slows equipment throughput, thereby increasing costs. For a back-thinned wafer, the uncertainty of a finished wafer 118 position due to distortion (also known as overlay) is typically fifty nm to two hundred nm. For small pixels, uncertainties of fifty to two hundred nm lead to significant color-filter array misalignment resulting in significant color cross talk. These uncertainties must be compared with a front-illuminated sensor where the overlay is typically less than twenty mm.

Referring again to FIG. 1(d), the prior art back-illuminated image sensor illustrates how grid distortion can result in color crosstalk between pixels. The two-sided arrow 128 represents the misalignment of the frontside photodetectors 130a, 130b, 130c with respect to the backside color filter elements 132a, 132b, 132c of a color filter array (CFA) when the CFA is fabricated using global alignment. With a frontside photodetector configuration, the grid distortion can result in light 134 leaking into a target photodetector (e.g., photodetector 130b) from an adjacent misaligned filter element (e.g., 132a).

SUMMARY

A back-illuminated image sensor includes a sensor layer of a first conductivity type having a frontside and a backside opposite the frontside. An insulating layer is disposed over the backside of the sensor layer. A circuit layer is formed adjacent the frontside of the sensor layer such that the sensor layer is positioned between the circuit layer and the insulating layer. One or more frontside regions of a second conductivity type are formed in at least a portion of the frontside of the sensor layer. A backside region of the second conductivity type is formed in the backside of the sensor layer. A plurality of frontside photodetectors of the first conductivity type is disposed in the sensor layer adjacent to the frontside. A distinct plurality of backside photodetectors of the first conductivity type separate from the frontside photodetectors is formed in the sensor layer adjacent to the backside and contiguous to portions of the backside region of the second conductivity type.

One or more voltage terminals can be electrically connected to either the frontside region, the backside region, or both the frontside and backside regions of the second conductivity type for biasing the region or regions to a respective voltage.

One or more connecting regions of the second conductivity type can be formed in respective portions of the sensor layer between the frontside and backside regions of the second conductivity type for electrically connecting one region to the other region.

Each frontside photodetector can be paired with a respective backside photodetector to form photodetector pairs. With photodetector pairs, one or more connecting regions of the second conductivity type can be disposed in respective portions of the sensor layer between each photodetector pair for electrically connecting together the frontside and backside photodetectors in the photodetector pairs.

An overflow drain can be disposed in a portion of the sensor layer between each photodetector pair.

One or more isolation regions of the second conductivity type can be formed in the sensor layer and partially surround each frontside and backside photodetector.

One or more channel regions of the first conductivity type can be disposed in the sensor layer between the first isolation regions and adjacent to each frontside and backside photodetector.

ADVANTAGES

The present invention has the advantage of providing an image sensor with increased photodetector charge capacity and improved color crosstalk performance.

BRIEF DESCRIPTION OF THE DRAWINGS

Embodiments of the invention are better understood with reference to the following drawings. The elements of the drawings are not necessarily to scale relative to each other.

DETAILED DESCRIPTION

Figure 1A:
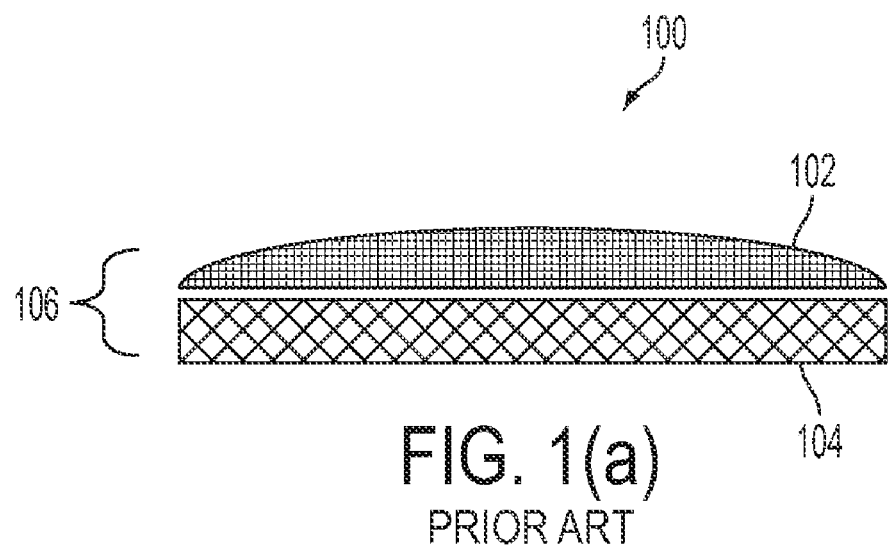
FIG. 1(a)-(d) illustrate a simplified process of fabricating a back-illuminated image sensor.
Figure 1B:
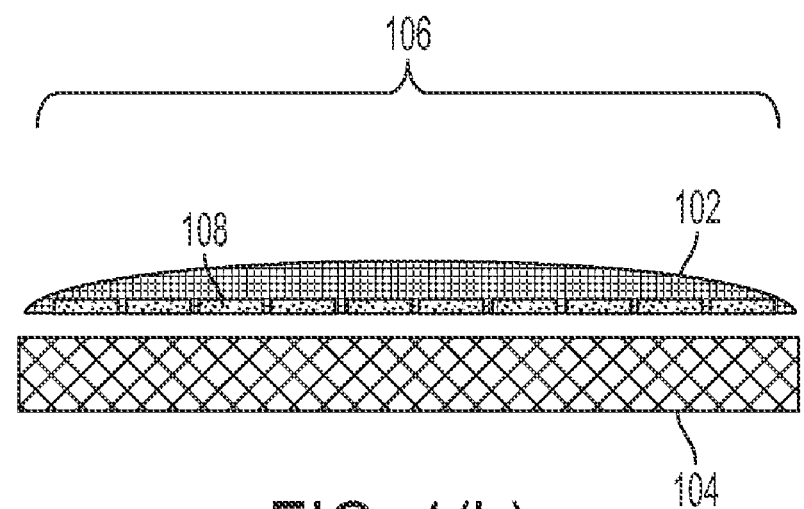
Figure 1C:
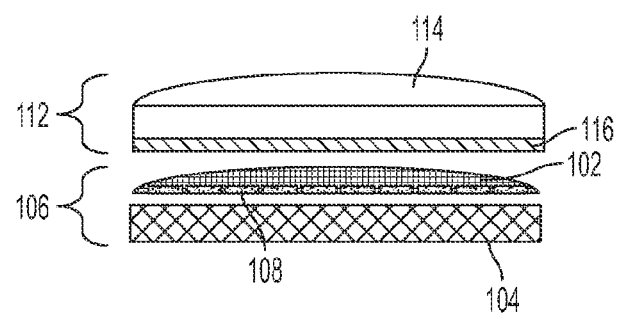
Figure 1D:
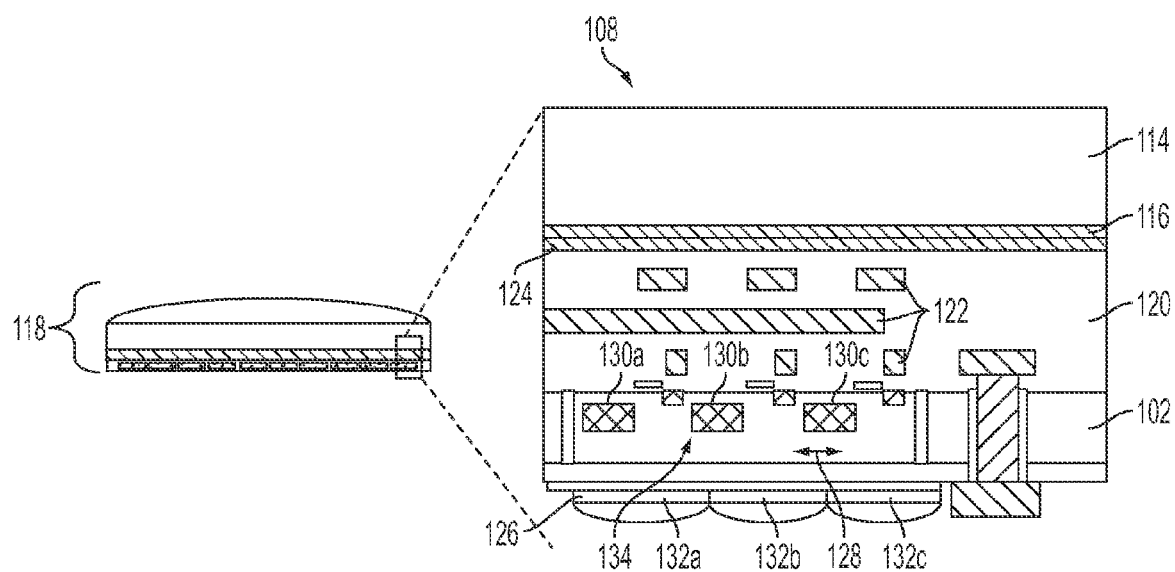
Figure 2:
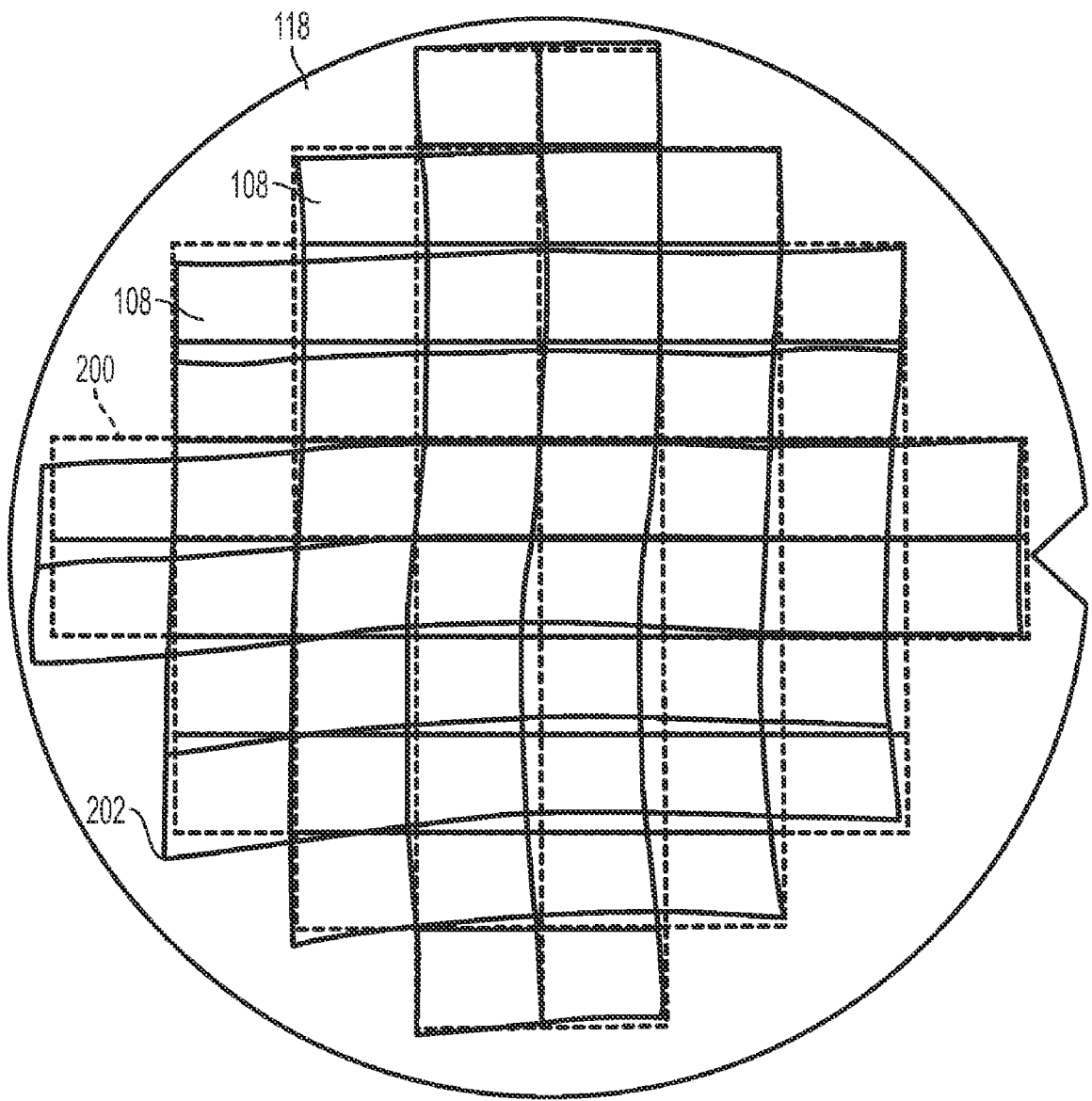
FIG. 2 is an exaggerate distortion pattern due to thinning and stress relaxation of epitaxial layer 102 shown in FIG. 1.

Throughout the specification and claims the following terms take the meanings explicitly associated herein, unless the context clearly dictates otherwise. The meaning of "a," "an," and "the" includes plural reference, the meaning of "in" includes "in" and "on" The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the terms "wafer" and "substrate" are to be understood as a semiconductor-based material including, but not limited to, silicon, silicon-on-insulator (SOI) technology, doped and undoped semiconductors, epitaxial layers formed on a semiconductor substrate, and other semiconductor structures.

Referring to the drawings, like numbers indicate like parts throughout the views.

Figure 3:
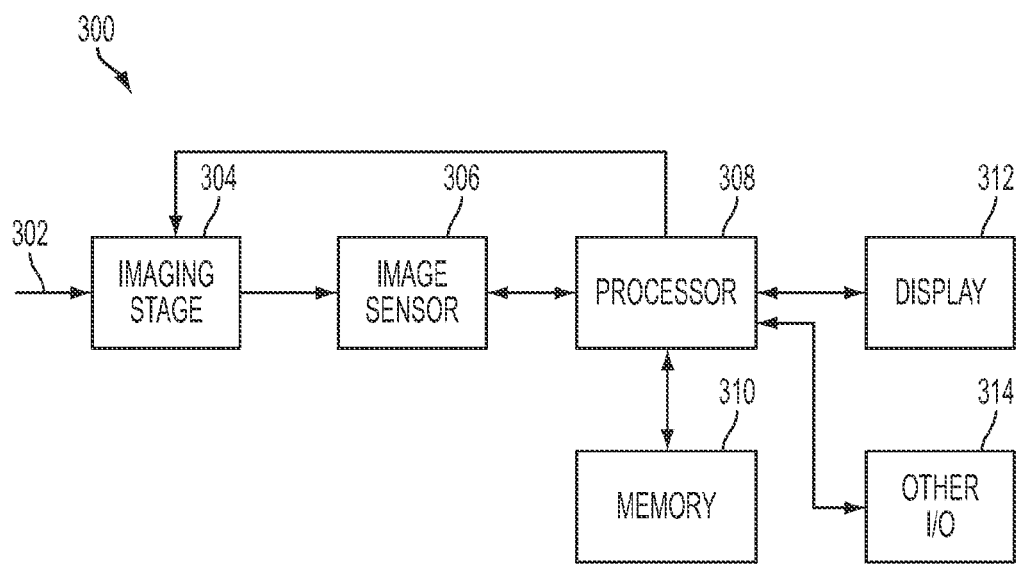
FIG. 3 is a simplified block diagram of an image capture device in an embodiment in accordance with the invention.

FIG. 3 is a simplified block diagram of an image capture device in an embodiment in accordance with the invention. Image capture device 300 is implemented as a digital camera in FIG. 3. Those skilled in the art will recognize that a digital camera is only one example of an image capture device that can utilize an image sensor incorporating the present invention. Other types of image capture devices, such as, for example, cell phone cameras, scanners, and digital video camcorders, can be used with the present invention.

In digital camera 300, light 302 from a subject scene is input to an imaging stage 304. Imaging stage 304 can include conventional elements such as a lens, a neutral density filter, an iris and a shutter. Light 302 is focused by imaging stage 304 to form an image on image sensor 306. Image sensor 306 captures one or more images by converting the incident light into electrical signals. Digital camera 300 her includes processor 308, memory 310, display 312, and one or more additional input/output (I/O) elements 314. Although shown as separate elements in the embodiment of FIG. 3, imaging stage 304 may be integrated with image sensor 306, and possibly one or more additional elements of digital camera 300, to form a compact camera module.

Processor 308 may be implemented, for example, as a microprocessor, a central processing unit (CPU), an application-specific integrated circuit (ASIC), a digital signal processor (DSP), or other processing device, or combinations of multiple such devices. Various elements of imaging stage 304 and image sensor 306 may be controlled by timing signals or other signals supplied from processor 308.

Memory 310 may be configured as any type of memory, such as, for example, random access memory (RAM), read-only memory (ROM), Flash memory, disk-based memory, removable memory, or other types of storage elements, in any combination. A given image captured by image sensor 306 may be stored by processor 308 in memory 310 and presented on display 312. Display 312 is typically an active matrix color liquid crystal display (LCD), although other types of displays may be used. The additional I/O elements 314 may include, for example, various on-screen controls, buttons or other user interfaces, network interfaces, or memory card interfaces.

It is to be appreciated that the digital camera shown in FIG. 3 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 4:
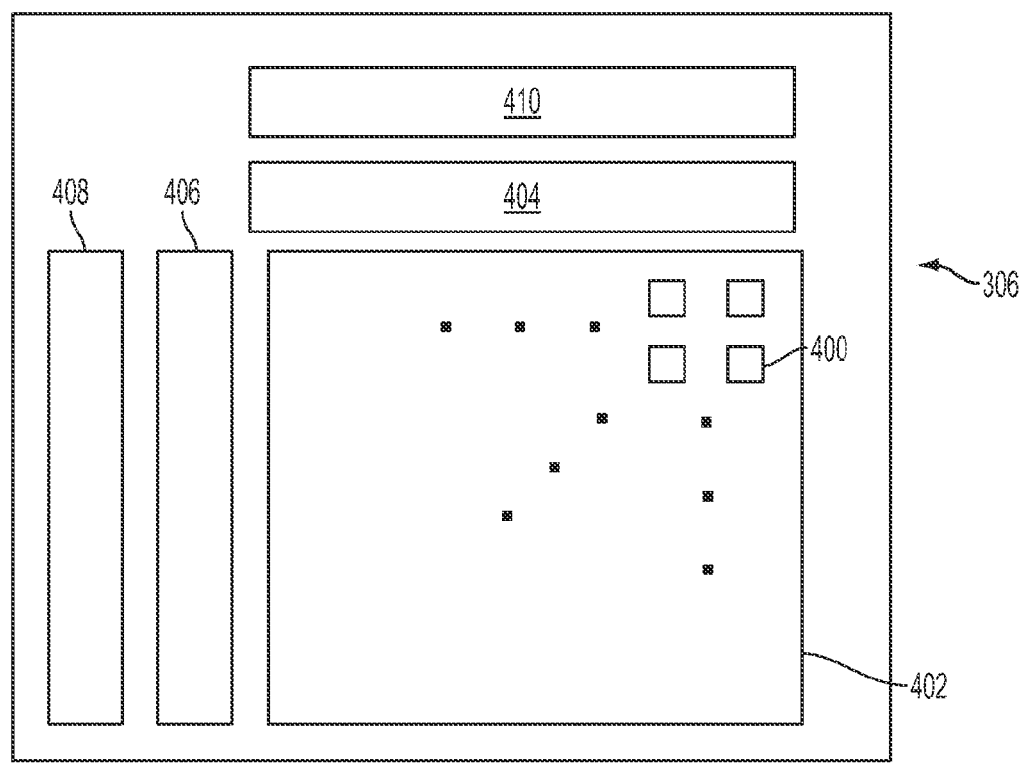
FIG. 4 is a simplified block diagram of image sensor 306 shown in FIG. 3 in an embodiment in accordance with the invention.

Referring now to FIG. 4, there is shown a simplified block diagram of image sensor 306 shown in FIG. 3 in an embodiment in accordance with the invention. Image sensor 306 typically includes an array of pixels 400 that form an imaging area 402. Image sensor 306 further includes column decoder 404, row decoder 406, digital logic 408, and analog or digital output circuits 410. Image sensor 306 is implemented as a back-illuminated Complementary Metal Oxide Semiconductor (CMOS) image sensor in an embodiment in accordance with the invention. Thus, column decoder 404, row decoder 406, digital logic 408, and analog or digital output circuits 410 are implemented as standard CMOS electronic circuits that are electrically connected to imaging area 402.

Functionality associated with the sampling and readout of imaging area 402 and the processing of corresponding image data may be implemented at least in part in the form of software that is stored in memory 310 and executed by processor 308 (see FIG. 3). Portions of the sampling and readout circuitry may be arranged external to image sensor 306, or formed integrally with imaging area 402, for example, on a common integrated circuit with photodetectors and other elements of the imaging area. Those skilled in the art will recognize that other peripheral circuitry configurations or architectures can be implemented in other embodiments in accordance with the invention.

Figure 5:
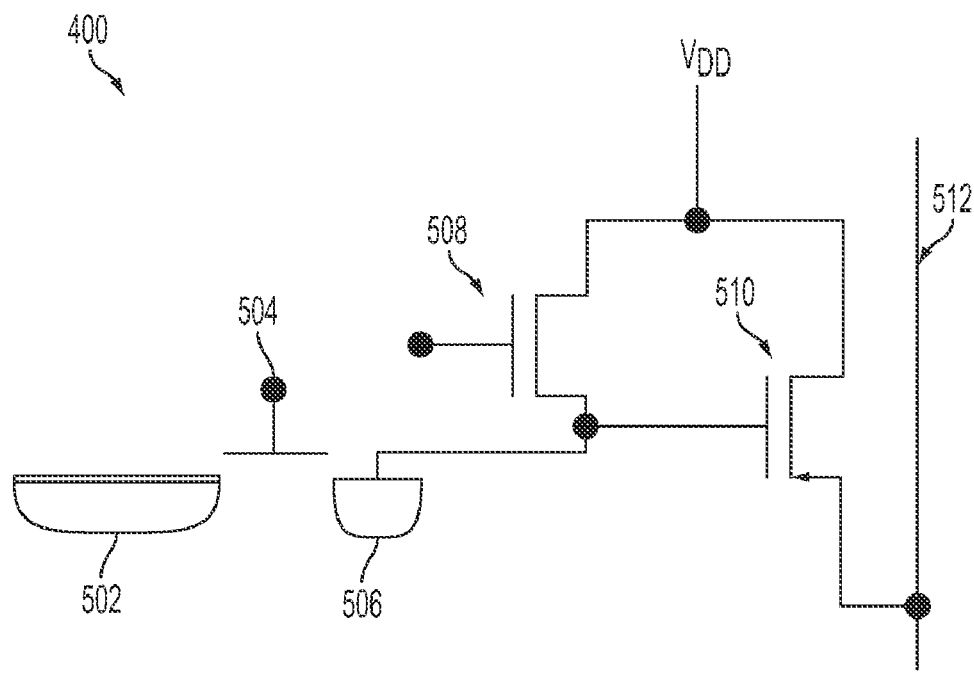
FIG. 5 is a schematic diagram illustrating a first exemplary implementation for pixel 400 shown in FIG. 4.

FIG. 5 is a schematic diagram illustrating a first exemplary implementation for pixel 400 shown in FIG. 4. Pixel 400 is a non-shared pixel that includes photodetector 502, transfer gate 504, charge-to-voltage conversion mechanism 506, reset transistor 508, and amplifier transistor 510, whose source is connected to output line 512. The drains of reset transistor 508 and amplifier transistor 510 are maintained at potential $V_{DD}$. The source of reset transistor 508 and the gate of amplifier transistor 510 are connected to charge-to-voltage conversion mechanism 506.

Photodetector 502 is configured as a pinned photodiode, charge-to-voltage conversion mechanism 506 as a floating diffusion, and amplifier transistor 510 as a source follower transistor in an embodiment in accordance with the invention. Pixel 400 can be implemented with additional or different components in other embodiments in accordance with the invention. By way of example only, photodetector 502 is configured as an unpinned photodetector in another embodiment in accordance with the invention.

Transfer gate 504 is used to transfer collected photo-generated charges from the photodetector 502 to charge-to-voltage conversion mechanism 506. Charge-to-voltage conversion mechanism 506 is used to convert the photo-generated charge into a voltage signal. Amplifier transistor 510 buffers the voltage signal stored in charge-to-voltage conversion mechanism 506 and amplifies and transmits the voltage signal to output line 512. Reset transistor 508 is used to reset charge-to-voltage conversion mechanism 506 to a known potential prior to readout. Output line 512 is connected to readout and image processing circuitry (not shown). As shown, the embodiment in FIG. 5 does not include a row select transistor when the image is read out using pulsed power supply mode.

Figure 6:
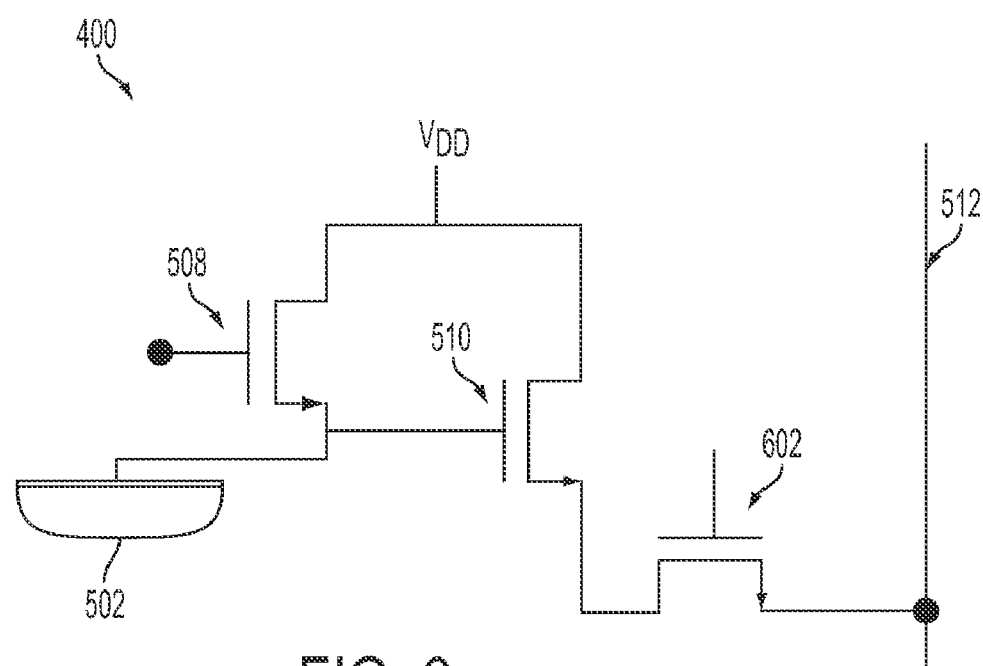
FIG. 6 is a schematic diagram illustrating a second exemplary implementation for pixel 400 shown in FIG. 4.

Although pixels with floating diffusions can provide added functionality and better performance, pixels without floating diffusions are sufficient for many applications. FIG. 6 is a schematic diagram illustrating a second exemplary implementation for pixel 400 shown in FIG. 4. Pixel 400 is a three-transistor pixel that includes photodetector 502, reset transistor 508, amplifier transistor 510, and row select transistor 602. The drains of reset transistor 508 and amplifier transistor 510 are maintained at potential $V_{DD}$. The source of reset transistor 508 and the gate of amplifier transistor 510 are connected to photodetector 502. The drain of row select transistor 602 is connected to the source of amplifier transistor 510 and the source of row select transistor 602 is connected to output line 512. Photodetector 502 is reset directly using reset transistor 508 and the integrated signal is sampled directly by amplifier transistor 510.

Embodiments in accordance with the invention are not limited to the pixel structures shown in FIGS. 5 and 6. Other pixel configurations can be used in other embodiments in accordance with the invention. By way of example only, a pixel structure that shares one or more components between multiple pixels can be used in an embodiment in accordance with the invention.

Figure 7:
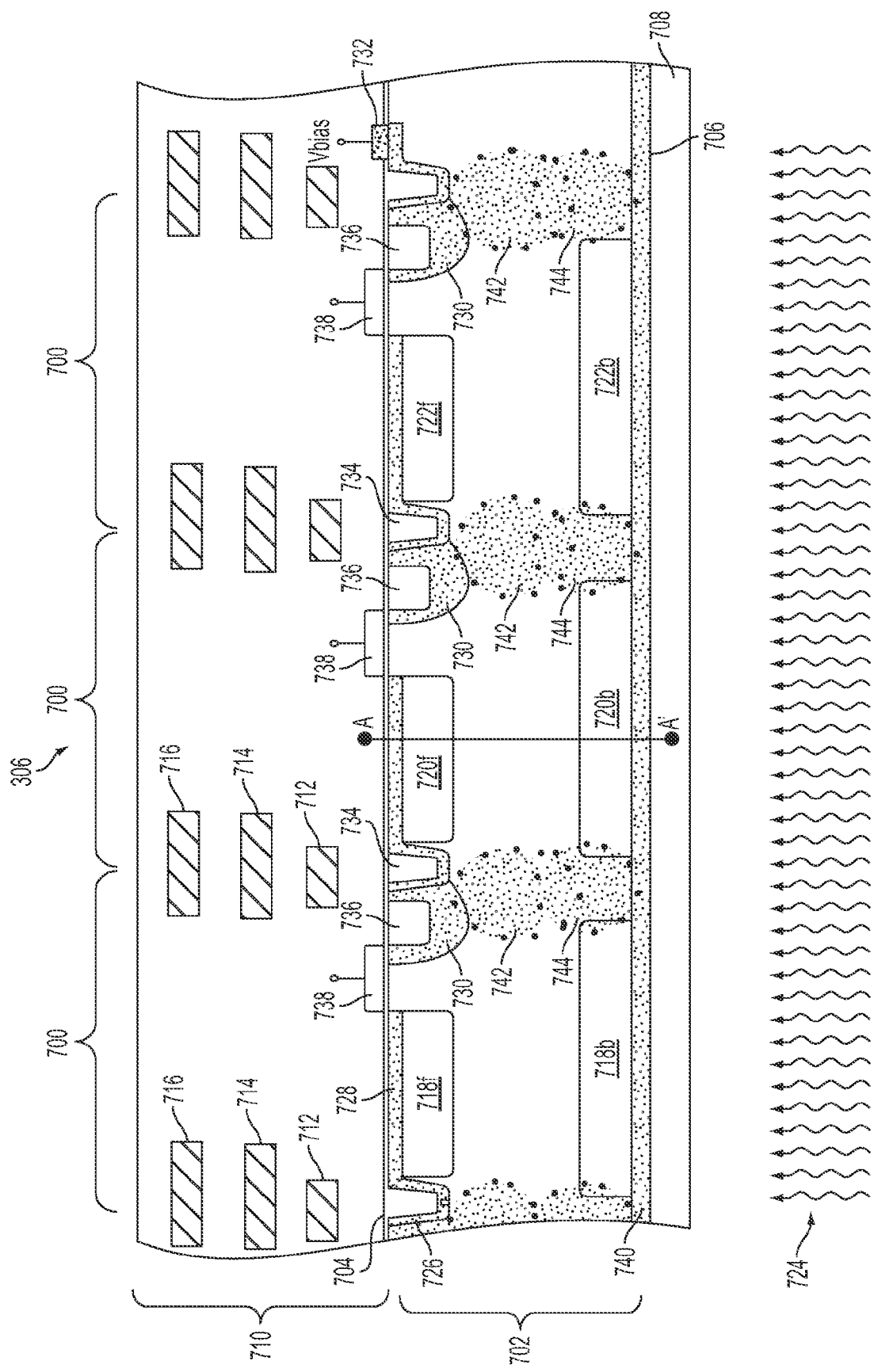
FIG. 7 illustrates a cross-sectional view of a portion of a first back-illuminated image sensor having frontside and backside photodetectors in an embodiment in accordance with the invention.

FIG. 7 illustrates a cross-sectional view of a portion of a first back-illuminated image sensor having frontside and backside photodetectors in an embodiment in accordance with the invention. Some of the elements shown in FIG. 7 are described herein as having specific types of conductivity. Other embodiments in accordance with the invention are not limited to these conductivity types. For example, all of the conductivity types may be reversed in another embodiment in accordance with the invention.

FIG. 7 depicts portions of three exemplary pixels 700 that can be included in image sensor 306. Image sensor 306 includes an active silicon sensor layer 702 formed with an epitaxial layer having a p-type conductivity. Sensor layer 702 includes a frontside 704 and a backside 706 opposite the frontside 704. An insulating layer 708 is disposed over the backside 706 and a circuit layer 710 is adjacent the frontside 704, such that the sensor layer 702 is situated between the circuit layer 710 and the insulating layer 708. The insulating layer 708 can be fabricated of silicon dioxide or other suitable dielectric material. The circuit layer 710 includes conductive interconnects 712, 714, 716, such as gates and connectors, that form the control circuitry for the image sensor 306 and electrically connect the circuit layer 710 to the sensor layer 702.

Each pixel 700 includes a respective frontside photodetector 718f, 720f, 722f having a p-type conductivity. Frontside photodetectors 718f, 720f, 722f collect charge carriers generated within the sensor layer 702 from light 724 incident on the backside 706 of sensor layer 702.

Frontside regions of n-type conductivity 726, 728, 730 are formed in the frontside of the sensor layer 702. Frontside regions 726, 728, 730 are electrically connected to a voltage terminal 732 for biasing the frontside regions 726, 728, 730 to a particular voltage level Vbias. In the illustrated embodiment, n-type frontside region 726 is configured as an n-type pinning layer that surrounds and lines the shallow trench isolation (STI) trench 734, n-type frontside region 728 as an n-type pinning layer that is formed over each photodetector 718f, 720f, 722f, and n-type frontside region 730 as a shallow n-well that surrounds a p-type charge-to-voltage conversion mechanism 736. Other n-type regions that are included in the embodiment but not shown in FIG. 7 include a shallow n-well that surrounds the p+ nodes of a reset and amplifier (e.g., source follower) transistor. Although not shown in the cross-section of FIG. 7, each of the shallow n-wells 730 surrounding each charge-to-voltage conversion mechanism 736 are continuously connected together electrically by other n-type implants such as the n-type pinning layers 726, 728.

Figure 8:
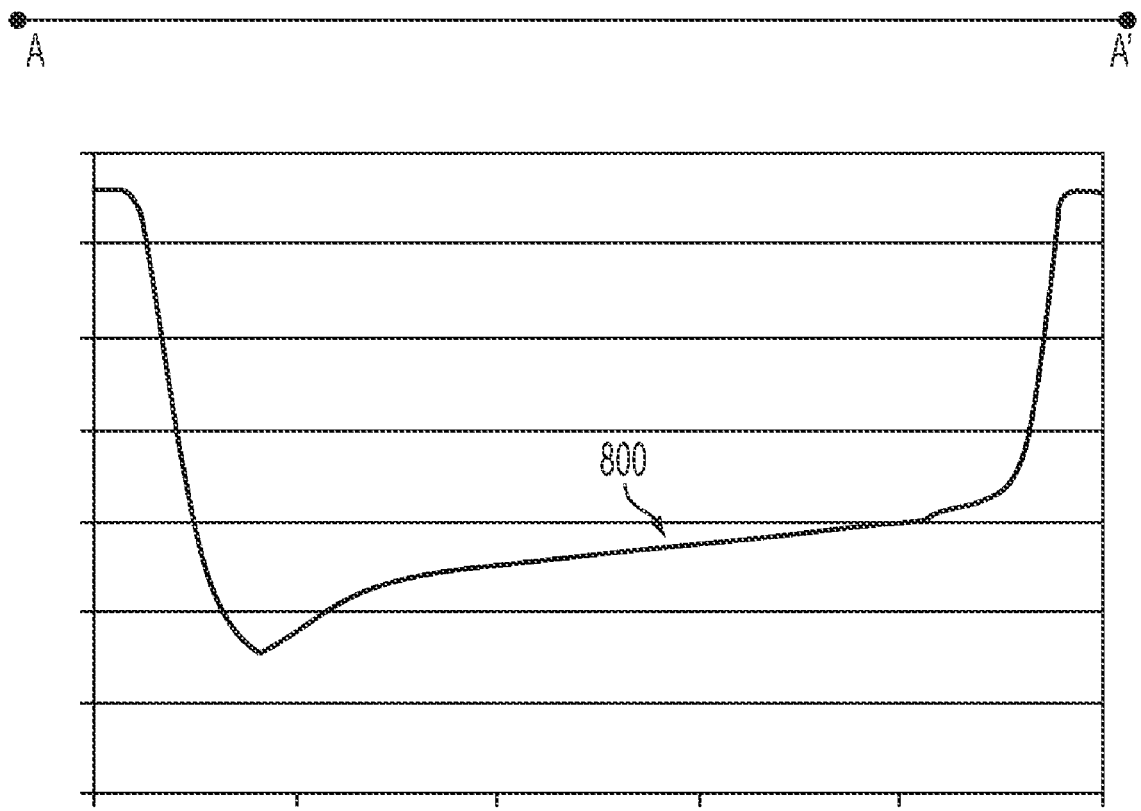
FIG. 8 is a plot of electrostatic potential versus distance along line A-A' in FIG. 7.

In addition to the frontside photodetectors 718f, 720f, 722f, each pixel includes a p-type backside photodetector 718b, 720b, 722b. Each pixel 700 therefore includes a respective frontside and backside p-type photodetector pair (718f, 718b), (720f, 720b), (722f, 722b) for collecting photo-generated charge carriers from light 724 incident on backside 706. FIG. 8 illustrates a plot of electrostatic potential versus distance along line A-A' in FIG. 7. Plot 800 depicts the electrostatic potential when photodetectors 720f, 720b are empty (contain zero photo-generated charge carriers). In the embodiment shown in FIG. 7, there are no wells or barriers between the pair of photodetectors 720f, 720b. Typically, in order to not have wells and barriers between a photodetector pair, the implant dose of the backside photodetector 718b, 720b, 722b is less than the frontside photodetector 718f, 720f, 722f. Simulations find that a typical increase in photodetector charge capacity for a photodetector pair configuration is between twenty-five percent (25%) and seventy-five percent (75%) compared to a frontside only photodetector configuration. The increase in photodetector capacity depends on several design features, including, but not limited to, the size of pixels 700 and the thickness of sensor layer 702.

A transfer gate 738 is used to transfer collected photo-generated charges from the frontside photodetectors 718f, 720f, 722f and the backside photodetectors 718b, 720b, 722b to respective charge-to-voltage conversion mechanisms 736. Charge-to-voltage conversion mechanisms 736 are configured as p-type floating diffusions in the illustrated embodiment. Each floating diffusion resides in a shallow n-well 730.

During charge transfer, the voltage on the transfer gate 738 is reduced to zero volts and the electrostatic channel potential underneath the transfer gate 738 is lower than that of the frontside photodetectors 718f, 720f, 722f in an embodiment in accordance with the invention. In one embodiment in accordance with the invention, the transfer of photo-generated charges from the photodetectors 718f, 718b, 720f, 720b, 722f, 722b to respective charge-to-voltage conversion mechanisms 736 is lag-free when there are no wells or barriers to hinder charge transfer, the electrostatic potential of the backside photodetectors 718b, 720b, 722b is greater than the electrostatic potential of the frontside photodetectors 718f, 720f, 722f, and the electrostatic potential of the frontside photodetectors 718f, 720f, 722f is greater than the electrostatic channel potential underneath the transfer gate 738 during charge transfer.

N-type frontside regions 726, 728 adjacent to the frontside 704 reduce dark current due to dangling silicon bonds at the interface between sensor layer 702 and circuit layer 710. Likewise, n-type backside region 740 adjacent to the backside 706 reduces dark current at the interface between sensor layer 702 and insulating layer 708. Like the n-type frontside regions 726, 728, the n-type backside region 740 can be connected to voltage terminal 732. In the embodiment shown in FIG. 7, backside region 740 is connected to voltage terminal 732 through n-type connecting regions 730, 742, 744.

In another embodiment in accordance with the invention, voltage terminal 732 is positioned on insulating layer 708 and electrically connected to backside region 740. N-type connecting regions 730, 742, 744 electrically connect backside region 740 to n-type frontside regions 726, 728, 730. A voltage applied to voltage terminal 732 biases both backside region 740 and n-type frontside regions 726, 728, 730 to a voltage in an embodiment in accordance with the invention.

Figure 9:
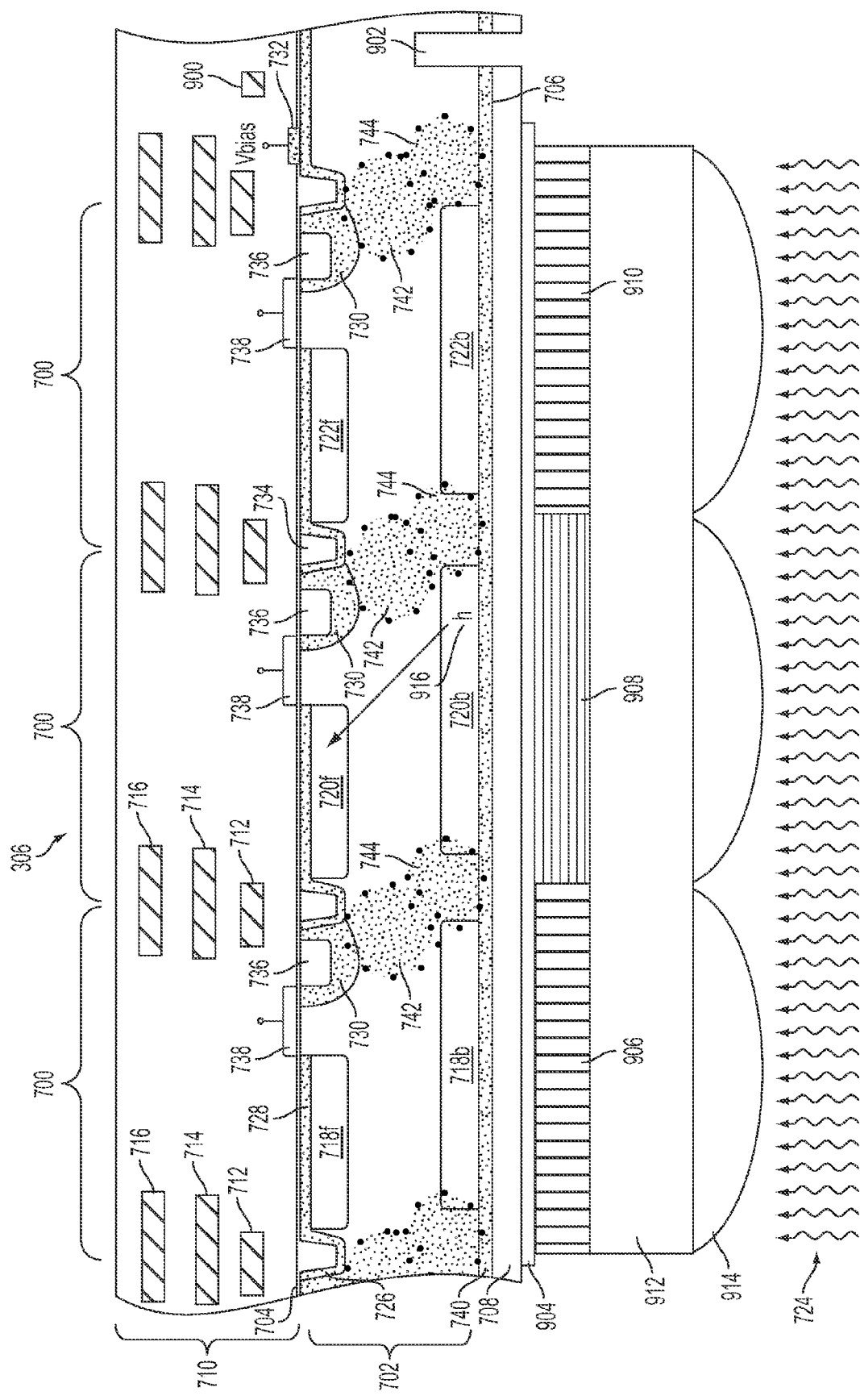
FIG. 9 depicts a cross-sectional view of a portion of a second back-illuminated image sensor having frontside and backside photodetectors in an embodiment in accordance with the invention.
Figure 10:
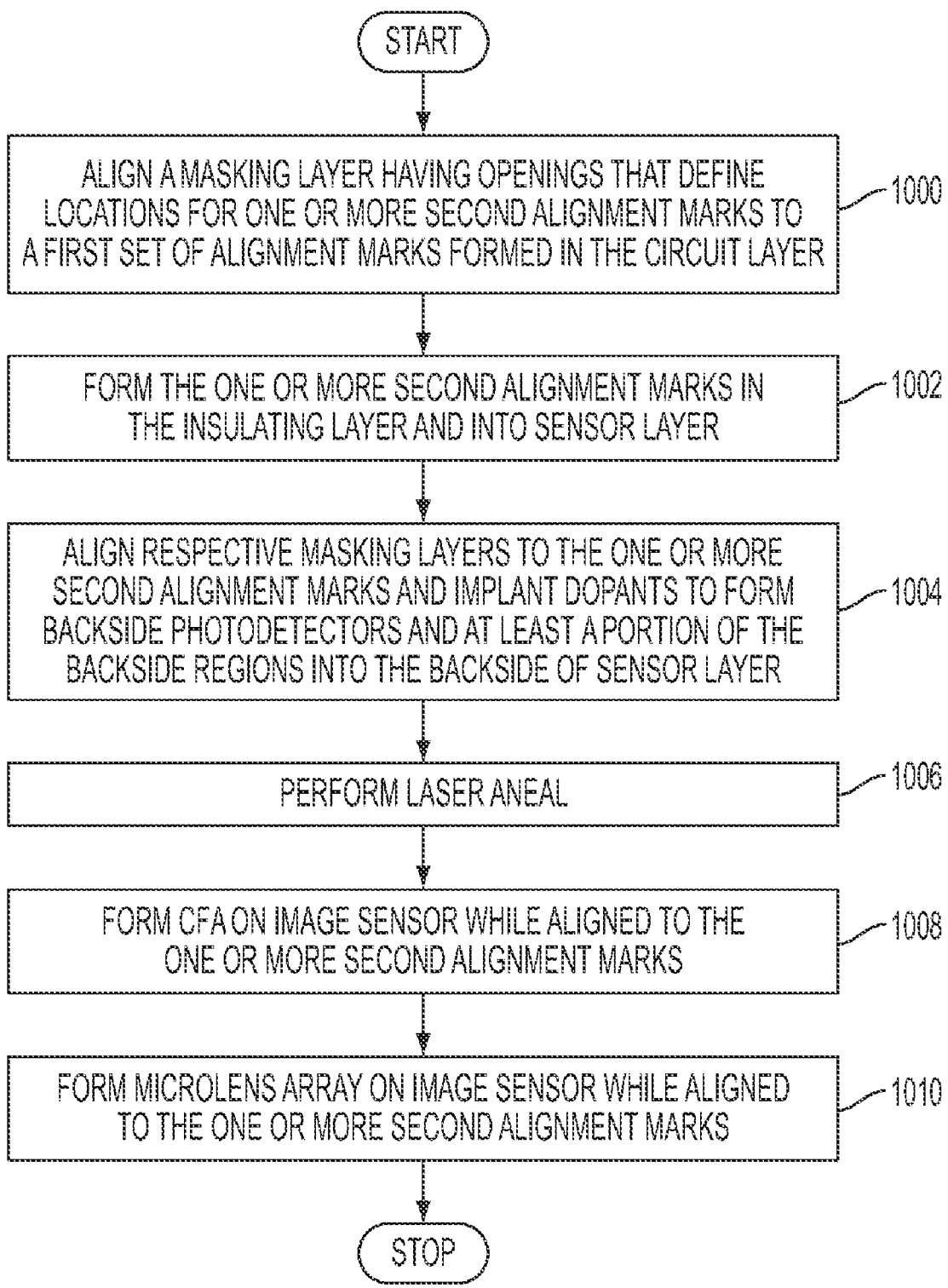
FIG. 10 is a flowchart of a method for fabricating a portion of the image sensor shown in FIG. 9 in an embodiment in accordance with the invention.

Referring now to FIG. 9, there is shown a cross-sectional view of a portion of a second back-illuminated image sensor having frontside and backside photodetectors in an embodiment in accordance with the invention. In particular, FIG. 9 illustrates a cross-section of the portions of the three pixels 700 shown in FIG. 7 after the performance of bonding and thinning procedures (interposer wafer not shown). A global alignment is typically performed using one of several known techniques after the sensor layer 702 is thinned. FIG. 10 is a flowchart of a method for fabricating a portion of the image sensor shown in FIG. 9 in an embodiment in accordance with the invention. An exemplary global alignment technique aligns a masking layer to one or more alignment marks in a first metal layer 900 using an infrared (IR) aligner (block 1000 in FIG. 10). In other embodiments in accordance with the invention, the one or more alignment marks are formed in different layers in circuit layer 710. Additionally, a polysilicon gate layer or a trench isolation layer can be used to form the first alignment marks.

By way of example only, the masking layer is implemented as a photoresist layer that masks an etch that defines a pattern or openings to be formed in a layer. As used herein, the term "aligns", "aligned", and "aligning" is defined as registering or substantially registering the one or more second alignment marks to the first alignment marks as closely as possible due to the grid distortion.

The one or more second alignment marks 902 are then etched into the insulating layer 708 and sensor layer 702 from the backside (block 1002 in FIG. 10). Etching the one or more second alignment marks (902 in FIG. 9) provides better alignment of the backside photodetector implants and the CFA in an embodiment in accordance with the invention. In another embodiment in accordance with the invention, the one or more second alignment marks 902 can be formed in the epitaxial layer in the sensor layer or in a metal layer.

After the second alignment marks 902 are etched, a masking layer is aligned to the second alignment marks and one or more dopants of an n conductivity type are implanted into the backside of sensor layer 702 to form backside region 740.

One or more masking layers is then aligned to the second alignment marks and one or more dopants of the n conductivity type are implanted to form backside photodetectors 718b, 720b, 722b and one or more n-type connecting regions 744 (block 1004 in FIG. 10). The dopants in these implanted areas are then activated with a laser anneal (block 1006 in FIG. 10). A thin spacer layer 904 is optionally deposited or spun coated on the wafer. An optical component, such as filter elements 906, 908, 910 of a CFA are then fabricated using the one or more second alignment marks 902 for alignment (block 1008 in FIG. 10). If desired, another spacer layer 912 is optionally deposited or spun coated on the wafer. A microlens array 914, which is another optical component, is then fabricated and aligned to the one or more second alignment marks 902 (block 1010 in FIG. 10). Optical components can be implemented as diffractive gratings, polarizing elements, birefringent materials, liquid crystals, and light pipes in other embodiments in accordance with the invention.

One benefit of globally aligning the one or more backside connecting regions 744, backside photodetectors 718b, 720b, 722b, color filter elements 906, 908, 910, and microlens array 914 to the same set of alignment marks is that any misalignment between these elements is not impacted by grid distortion.

FIG. 9 will now be used to illustrate how photo-generated charge carriers are directed to the correct pixel, thereby reducing pixel-to-pixel color crosstalk. By way of example only, assume center filter element 908 transmits light propagating in the wavelengths associated with the color blue (blue photons). Almost all of the blue photons generate charge carriers near the surface of backside 706. Charge carrier 916 represents one of these photo-generated charge carriers. Charge carrier 916 is a hole (h) in the embodiment shown in FIG. 9. If there are no backside photodetectors 718b, 720b, 722b, then charge carrier 916 has a near equal probability of migrating into either frontside photodetector 720f or frontside photodetector 722f. However, with the photodetector pair configuration shown in FIGS. 7 and 9, each backside photodetector 718b, 720b, 722b is aligned with their respective filter elements 909, 908, 910. Consequently, charge carrier 916 drifts to the center of backside photodetector 720b and from there is directed into the correct frontside photodetector 720f. In summary, aligning the backside photodetectors 718b, 720b, 722b to filter elements 906, 908, 910 reduces pixel-to-pixel crosstalk caused by grid distortions.

Figure 11:
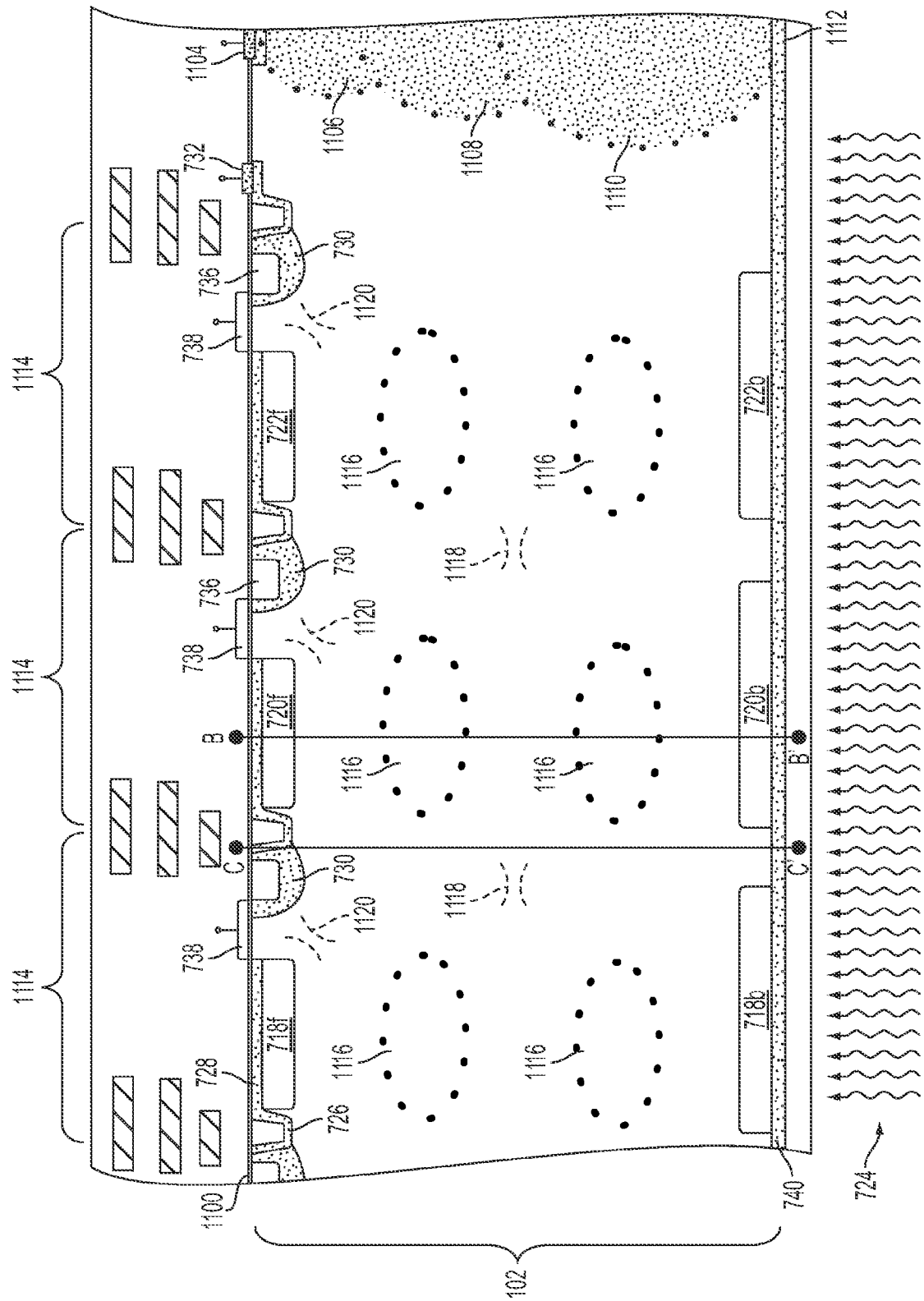
FIG. 11 illustrates a cross-sectional view of a portion of a third back-illuminated image sensor having frontside and backside photodetectors in an embodiment in accordance with the invention.

Referring now to FIG. 11, there is shown a cross-sectional view of a portion of a third back-illuminated image sensor having frontside and backside photodetectors in an embodiment in accordance with the invention. In this embodiment, a-type frontside regions 726, 728, 730 are biased at one voltage potential while n-type backside region 740 is biased at a different voltage potential. The n-type frontside regions adjacent to frontside 1100 of active silicon sensor layer 1102 are biased to a known voltage level VbiasA through the voltage terminal 732. N-type backside region 740 is connected to another voltage terminal 1104 through n-type connecting regions 1106, 1108, 1110. N-type backside region 740 is biased to a known voltage level VbiasB through voltage terminal 1104. In one embodiment in accordance with the invention, voltage terminal 1104 is positioned at the edge of the imaging array (e.g., edge of the array of pixels 400 shown in FIG. 4), and is connected by one or more contacts from the backside 1112 of sensor layer 1102. In one embodiment in accordance with the invention, an additional ground contact is disposed between voltage terminals 732, 1104 to eliminate biasing issues during power-up.

Establishing a voltage difference between frontside 1100 and backside 1112 of sensor layer 1102 improves color crosstalk performance by creating an electric field between the backside 1112 and frontside 1100 that forces the photo-generated charge carriers into the nearest photodetector. This additional electric field allows for the use of a thicker sensor layer 1102 with improved color crosstalk performance. By way of example only, for a 1.4 micrometer by 1.4 micrometer pixel, color crosstalk performance typically becomes unacceptable for a sensor layer 1102 thickness greater than 2 micrometers. However, for a one volt difference between backside 1112 and frontside 1100, for a sensor layer 1102 thickness of six micrometers, color crosstalk performance is nearly identical to the two micrometer thickness. A thicker sensor layer 1102 typically has better red and near IR response, which is desirable in many image sensor applications such as security and automotive.

Each pixel 1114 includes a respective frontside and backside p-type photodetector pairs (718f, 718b), (720f, 720b), (722t, 722b) for collecting photo-generated charge carriers from light 724 incident on backside 1112. Transfer gates 738 are used to transfer collected photo-generated charge carriers from the photodetector pairs (718f, 718b), (720f, 720b), (722f, 722b) to respective charge-to-voltage conversion mechanisms 736.

Figure 12:
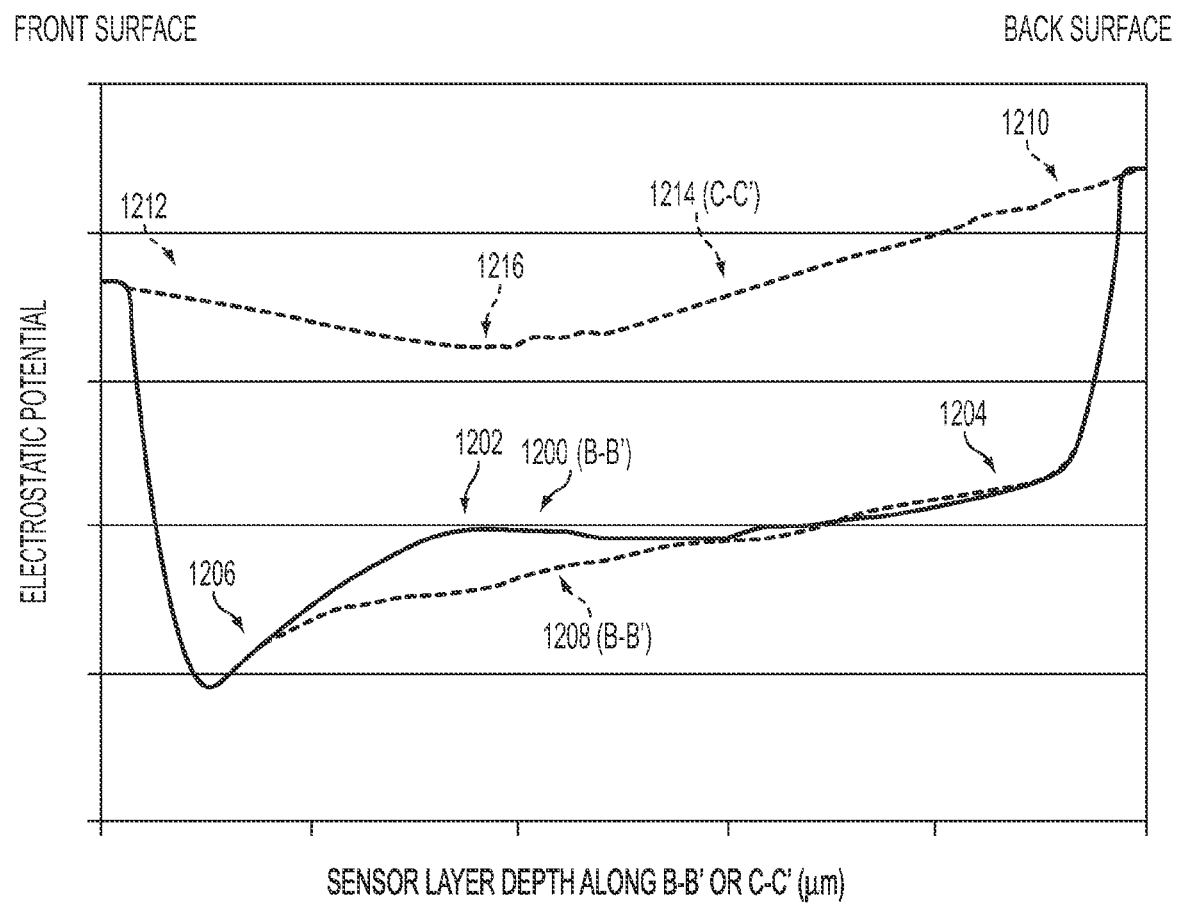
FIG. 12 is a plot of electrostatic potential versus distance along lines B-B' and C-C' in FIG. 11.

Depending on the size of each pixel 1114 and the thickness of sensor layer 1102, additional touch-up implant regions 1116 of the first conductivity type (e.g., p conductivity type) can be used to remove any wells and barriers between backside photodetectors 718b, 720b, 722b and frontside photodetectors 718f, 720f, 722f. The benefit of touch-up implant regions 1116 is illustrated in FIG. 12. Solid line 1200 shows an exemplary electrostatic potential profile versus distance (for the zero photo-carriers case) along line B-B' in FIG. 11 without touch-up implant regions 1116. A barrier 1202 is present that prevents charge carriers collected within the backside photodetector region 1204 from moving to the frontside photodetector region 1206 and subsequently into the respective charge-to-voltage conversion region. Dashed line 1208 shows an exemplary electrostatic potential profile with touch-up implant regions 1116. The barrier is removed and the photodetector-pair configuration now operates lag free.

FIG. 12 illustrates other aspects of a "well engineered" photodetector pair. The electrostatic potential of the backside 1210 is higher than the electrostatic potential for the frontside 1212. Because of this potential or voltage difference, for some pixel designs the dose of the backside photodetectors 718b, 728b, 722b may be greater than that of the frontside photodetectors 718f, 720f, 722f and still be well and barrier free. This is rarely the case when the frontside 1212 and backside 1210 electrostatic potentials are equal. Increasing the photodetector implant dose increases the photodetector charge capacity. Thus, a "well engineered" photodetector is lag-free (zero wells and barriers) and maximizes photodetector capacity.

Dashed line 1214 represents an exemplary electrostatic potential profile versus distance (for the zero photo-carriers case) along line C-C' in FIG. 11. The minimum point 1216 on line 1214 represents the minimum electrostatic potential between two photodetector pairs, and is commonly referred to as the "saddle-point." Exemplary saddle point locations are identified as locations 1118 in FIG. 11. Upon illumination, a single photodetector pair fills up with photo-generated charge carriers. At some point in time the photodetector pair reaches saturation. When the excess charge spills over the saddle point 1216 (see 1118 in FIG. 11), the excess charge blooms into the adjacent photodetector pair. Pixel-to-pixel blooming can lead to numerous image artifacts including "snowballs", where one defective photodetector creates a multiple pixel defect, and "linearity kink", where the color fidelity at low signal levels is different from that at high signal levels.

Introducing an overflow drain point within between photodetector pair that is lower in electrostatic potential than the saddle point 1216 reduces pixel-to-pixel blooming. In one embodiment in accordance with the invention, a lateral overflow drain is included within each pixel structure. In another embodiment in accordance with the invention, a natural overflow drain exists between each photodetector pair (718*f*, 718*b*), (720*f*, 720*b*), (722*f*, 722*b*) and their respective charge-to-voltage conversion mechanism 736. Typically, this natural overflow drain point (e.g., location 1120 in FIG. 11) resides a few tenths of a micron underneath each transfer gate 738. If the implant doses in the vicinity of the transfer gates 738 are manipulated properly, the natural overflow drain point can be lower than saddle point 1216 (1116 in FIG. 11).

If the natural overflow drain (1120 in FIG. 11) is not lower in electrostatic potential than the pixel-to-pixel saddle point 1216, then a small voltage pulse can be applied to all transfer gates 738 between reading out each row of pixels. This small voltage pulse lowers the electrostatic potential at the natural overflow drain (e.g., 1120 in FIG. 11) and bleeds off the excess charge within the photodetector pair before blooming occurs.

Figure 13:
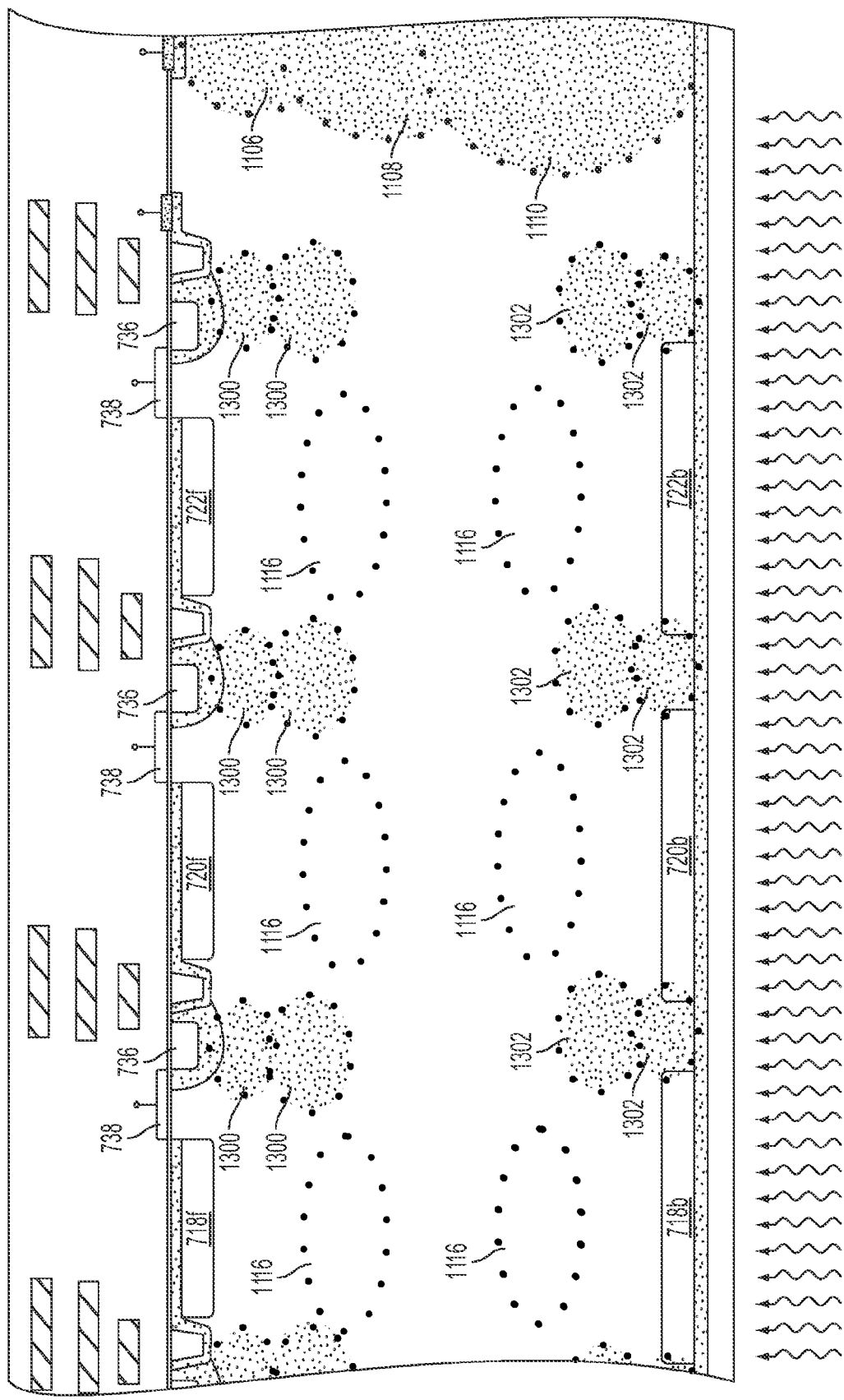
FIG. 13 depicts a cross-sectional view of a portion of a fourth back-illuminated image sensor having frontside and backside photodetectors in an embodiment in accordance with the invention.

Referring now to FIG. 13, there is shown a cross-sectional view of a portion of a fourth back-illuminated image sensor having frontside and backside photodetectors in an embodiment in accordance with the invention. The structure depicted in FIG. 13 is similar to that in FIG. 12 with the addition of one or more n-type frontside isolation regions 1300 and n-type backside isolation regions 1302. The additional isolation regions 1300, 1302 are formed between neighboring photodetectors and raise the electrostatic potential of saddle point 1216 (FIG. 12) and increase the pixel-to-pixel isolation. Frontside isolation regions 1300 are implanted during frontside processing and backside isolation regions 1302 during backside processing in an embodiment in accordance with the invention. In one embodiment in accordance with the invention, the method depicted in FIG. 10 can be used to form the image sensor shown in FIG. 13 with block 1004 including the formation of the one or more backside isolation regions 1302.

Figure 14:
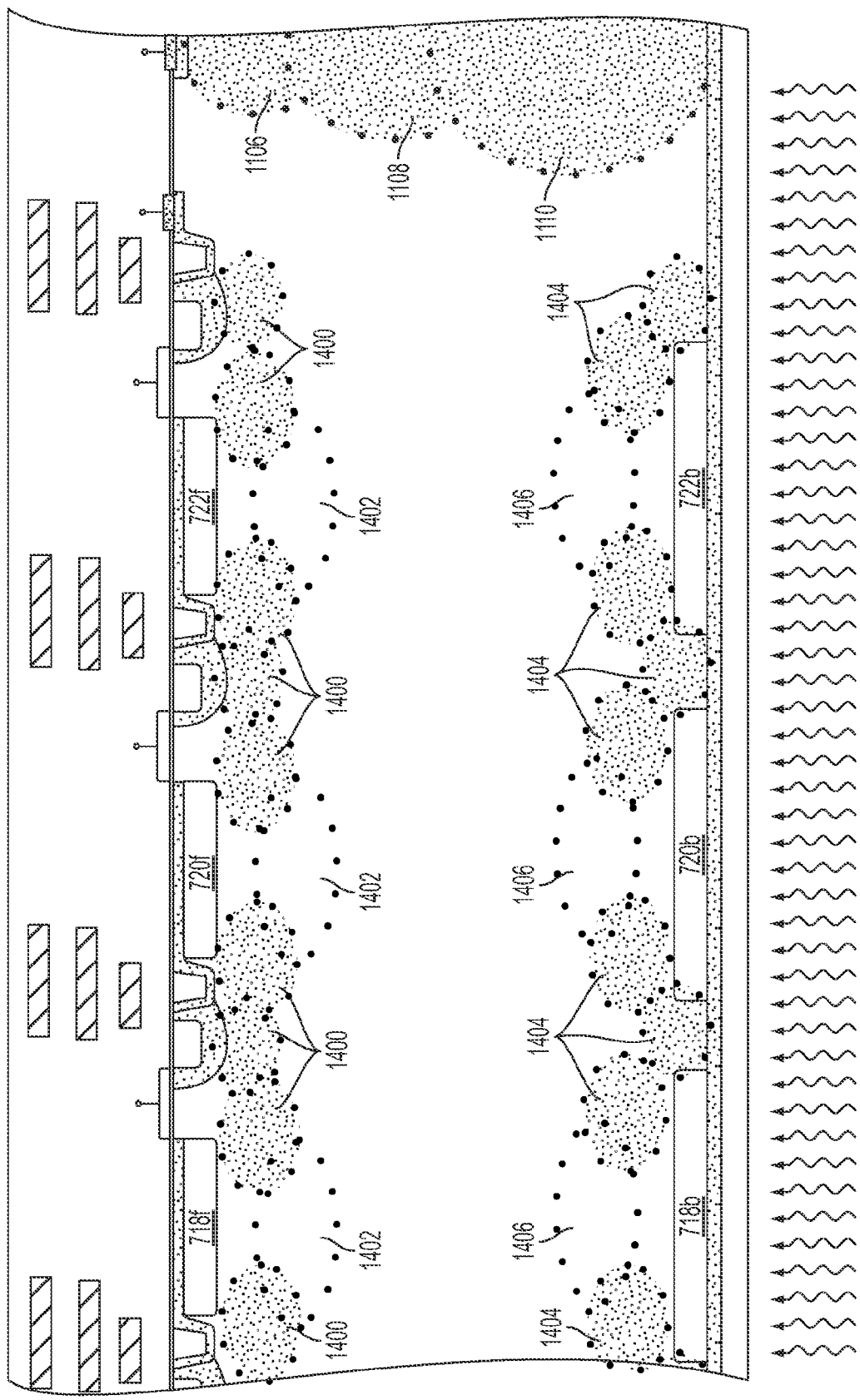
FIG. 14 illustrates a cross-sectional view of a portion of a fifth back-illuminated image sensor having frontside and backside photodetectors in an embodiment in accordance with the invention.

FIG. 14 illustrates a cross-sectional view of a portion of a fifth back-illuminated image sensor having frontside and backside photodetectors in an embodiment in accordance with the invention. N-type frontside isolation regions 1400 and p-type channel regions 1402 surround frontside photodetectors 718*f*, 720*f*, 722*f* while n-type backside isolation region 1404 and p-type backside channel region 1406 surround backside photodetectors 718*b*, 720*b*, 722*b* in the embodiment shown in FIG. 14. Other embodiments in accordance with the invention may form n-type isolation regions 1400, 1404 and p-type channel regions 1402, 1406 such that the regions partially surround each photodetector. In one embodiment in accordance with the invention, the method depicted in FIG. 10 can be used to fabricate the image sensor shown in FIG. 14 with block 1004 including the formation of backside isolation regions 1404 or backside channel regions 1406.

N-type frontside and backside isolation regions 1400, 1404 serve several purposes. First, like isolation regions 1300, 1302 in FIG. 13, frontside and backside isolation regions 1400, 1404 improve the isolation between photodetectors. Second, isolation regions 1400, 1404 partially wrap around photodetectors 718*f*, 718*b*, 720*f*, 720*b*, 722*f*, 722*b*, increasing the capacity of the photodetectors. Additionally, p-type frontside and backside channel regions 1402, 1406 remove wells and barriers between the backside photodetectors 718*b*, 720*b*, 722*b* and frontside photodetectors 718*f*, 720*f*, 722*f*. In other embodiments in accordance with the invention, additional p-type channel regions can be formed between regions 1402, 1406 to reduce or eliminate any residual wells and barriers.

Figure 15:
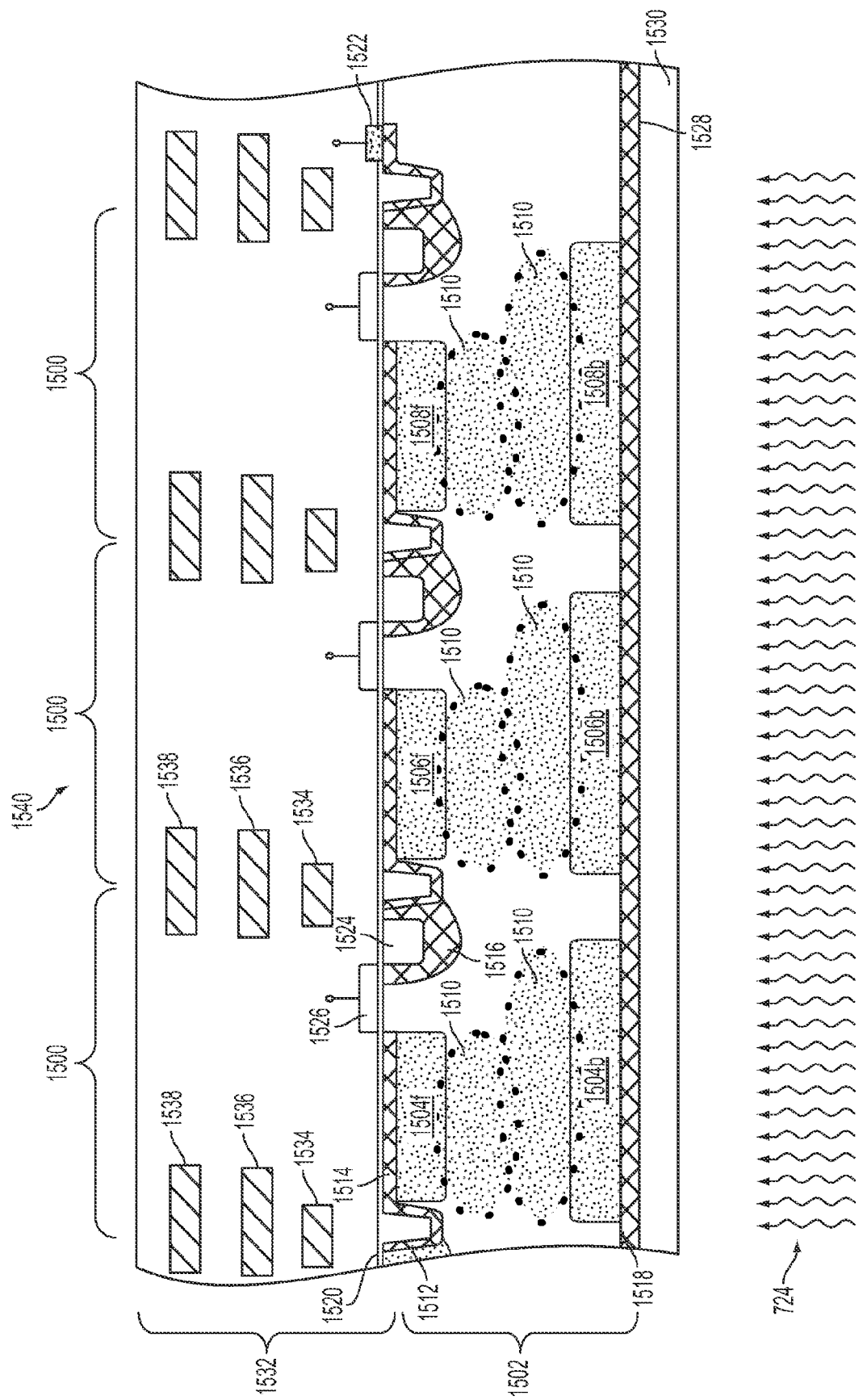
FIG. 15 depicts a cross-sectional view of a portion of a sixth back-illuminated image sensor having frontside and backside photodetectors in an embodiment in accordance with the invention.

Referring now to FIG. 15, there is shown a cross-sectional view of a portion of a sixth back-illuminated image sensor having frontside and backside photodetectors in an embodiment in accordance with the invention. FIG. 15 depicts a cross-sectional view through three n-type metal oxide semiconductor (NMOS) pixels 1500 with a photodetector pair structure fabricated using the standard CMOS process (p-epitaxial layer in sensor layer 1502 as starting material). The structure is similar to the PMOS photodetector pair structure shown in FIG. 7 with the p-type and n-type implants reversed in conductivity. However, there are several notable differences between FIG. 7 and FIG. 15. First, for the NMOS photodetector pairs (1504*f*, 1504*b*), (1506*f*, 1506*b*), (1508*f*, 1508*b*), an n-type channel is created between each photodetector pair with n-type channel regions 1510, but in FIG. 7 the p-type sensor layer 702 creates the channel connecting the p-type photodetector pairs. Second, for the NMOS photodetector pairs (1504*f*, 1504*b*), (1506*f*, 1506*b*), (1508*f*, 1508*b*), the p-type sensor layer 1502 is used for isolation and also for electrically connecting the p-type frontside regions 1512, 1514, 1516 to the p-type backside region 1518, but in FIG. 7 the n-type connecting regions 742, 744 provide the isolation and electrical connection.

Otherwise, the exemplary NMOS photodetector pair structure shown in FIG. 15 is similar to the exemplary PMOS photodetector pair structure of FIG. 7. The p-type frontside regions 1512, 1514, 1516 adjacent the frontside 1520 of sensor layer 1502 is connected to a voltage terminal 1522 for biasing p-type frontside regions 1512, 1514, 1516. The shallow p-type frontside region 1516 surrounds the n-type charge-to-voltage conversion mechanisms 1524. Transfer gates 1526 control the transfer of charge from photodetector pairs (1504*f*, 1504*b*), (1506*f*, 1506*b*), (1508*f*, 1508*b*) to respective charge-to-voltage conversion mechanism 1524. P-type backside region 1518 is formed in sensor layer 1502 adjacent to the backside 1528 and reduces dark current. Insulating layer 1530 is situated adjacent to backside 1528 while circuit layer 1532 is adjacent to frontside 1520. Circuit layer 1532 includes conductive interconnects 1534, 1536, 1538, such as gates and connectors that form control circuitry for the image sensor 1540.

A portion of the embodiment shown in FIG. 15 can be fabricated using the method illustrated in FIG. 10. The conductivity type of the one or more dopants used to form backside photodetectors 1504*b*, 1506*b*, 1508*b* is n-type while the conductivity type of the one or more dopants used to form backside region 1518 is p-type. Additionally, the conductivity type of the one or more dopants used to form one or more channel regions 1510 is n-type.

The invention has been described in detail with particular reference to certain embodiments thereof, but it will be understood that variations and modifications can be effected within the spirit and scope of the invention. Additionally, even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST

100 Standard Complementary Metal Oxide Semiconductor Wafer
102 epitaxial layer
104 substrate
106 device wafer
108 image sensor
112 interposer wafer
114 silicon layer
116 adhesive layer
118 finished wafer
120 insulating layer
122 conductive interconnects
124 adhesive layer
126 color filter array (CFA)
128 two-sided arrow representing misalignment
130a frontside photodetector
130b frontside photodetector
130c frontside photodetector
132a color filter element
132b color filter element
132c color filter element
134 light
200 dashed line representing undistorted wafer map
202 solid line representing distorted wafer pattern
300 image capture device
302 light
304 imaging stage
306 image sensor
308 processor
310 memory
312 display
314 other I/O
400 pixel
402 imaging area
404 column decoder
406 row decoder
408 digital logic
410 analog or digital output circuits
502 photodetector
504 transfer gate
506 charge-to-voltage conversion mechanism
508 reset transistor
510 amplifier transistor
512 output line
602 row select transistor
700 pixel
702 sensor layer
704 frontside of sensor layer
706 backside of sensor layer
708 insulating layer
710 circuit layer
712 conductive interconnect
714 conductive interconnect
716 conductive interconnect
718f frontside photodetector
718b backside photodetector
720f frontside photodetector
720b backside photodetector
722f frontside photodetector
722b backside photodetector
724 light
726 frontside region
728 frontside region
730 frontside region
732 voltage terminal
734 shallow trench isolation (STI)
736 charge-to-voltage conversion mechanism
738 transfer gate
740 backside region
742 connecting region
744 connecting region
800 plot of electrostatic potential
900 first metal layer
902 alignment mark
904 spacer layer
906 color filter element
908 color filter element
910 color filter element
912 spacer layer
914 microlens array
916 charge carrier
1000-1010 blocks
1100 frontside of sensor layer
1102 sensor layer
1104 voltage terminal
1106 connecting region
1108 connecting region
1110 connecting region
1112 backside of sensor layer
1114 pixel
1116 touch-up implant regions
1118 location of saddle-point
1120 natural overflow drain
1200 solid line
1202 barrier
1204 frontside photodetector region
1206 backside photodetector region
1208 dashed line
1210 electrostatic potential of backside
1212 electrostatic potential of frontside
1214 dashed line
1216 minimum or saddle-point
1300 isolation region
1302 isolation region
1400 frontside isolation region
1402 frontside channel region
1404 backside isolation region
1406 backside channel region
1500 pixel
1502 sensor layer
1504f frontside photodetector
1504b backside photodetector
1506f frontside photodetector
1506b backside photodetector
1508f frontside photodetector
1508b backside photodetector
1510 channel region
1512 frontside region
1514 frontside region
1516 frontside region
1518 backside region
1520 frontside of sensor layer
1522 voltage terminal
1524 charge-to-voltage conversion mechanism
1526 transfer gate
1528 backside of sensor layer
1530 insulating layer
1532 circuit layer
1534 conductive interconnect
1536 conductive interconnect
1538 conductive interconnect
1540 image sensor

The invention claimed is:

1. A back-illuminated image sensor, comprising:
a sensor layer of a first conductivity type having a frontside and a backside opposite the frontside;
an insulating layer disposed on the backside of the sensor layer;
a circuit layer electrically connected to the sensor layer and adjacent to the frontside of the sensor layer;
one or more frontside regions of a second conductivity type formed in at least a portion of the frontside of the sensor layer;
a backside region of the second conductivity type formed in the backside of the sensor layer;
a plurality of frontside photodetectors of the first conductivity type for converting light incident on the backside of the sensor layer into photo-generated charges, wherein the plurality of frontside photodetectors is disposed in the sensor layer and adjacent to the frontside;
a discrete plurality of backside photodetectors of the first conductivity type separate from the plurality of frontside photodetectors for converting light incident on the backside of the sensor layer into photo-generated charges, wherein the plurality of backside photodetectors is disposed in the sensor layer and contiguous to portions of the backside region of the second conductivity type, and wherein each frontside photodetector is paired with a respective backside photodetector to form photodetector pairs and a portion of the sensor layer is contiguously disposed between each frontside photodetector and paired respective backside photodetector; and
one or more connecting regions of the second conductivity type contiguously disposed between respective frontside regions and the backside region and laterally adjacent to each photodetector pair for electrically connecting the frontside and backside regions to one another.

2. The back-illuminated image sensor as in claim 1, further comprising a voltage terminal electrically connected to at least one frontside region of the second conductivity type for biasing the one or more frontside regions to a voltage.

3. The back-illuminated image sensor as in claim 1, wherein the first conductivity type comprises a p conductivity type and the second conductivity type comprises an n conductivity type.

4. An image capture device, comprising:
a back-illuminated image sensor, comprising:
a sensor layer of a first conductivity type having a frontside and a backside opposite the frontside;
an insulating layer disposed on the backside of the sensor layer;
a circuit layer electrically connected to the sensor layer and adjacent to the frontside of the sensor layer;
one or more frontside regions of a second conductivity type formed in at least a portion of the frontside of the sensor layer;
a backside region of the second conductivity type formed in the backside of the sensor layer;
a plurality of frontside photodetectors of the first conductivity type for converting light incident on the backside of the sensor layer into photo-generated charges, wherein the plurality of frontside photodetectors is disposed in the sensor layer and adjacent to the frontside; and
a discrete plurality of backside photodetectors of the first conductivity type separate from the plurality of frontside photodetectors for converting light incident on the backside of the sensor layer into photo-generated charges, wherein the plurality of backside photodetectors is disposed in the sensor layer and contiguous to portions of the backside region of the second conductivity type, and wherein each frontside photodetector is paired with a respective backside photodetector to form photodetector pairs and a portion of the sensor layer is contiguously disposed between each frontside photodetector and paired respective backside photodetector; and
one or more connecting regions of the second conductivity type contiguously disposed between respective frontside regions and the backside region and laterally adjacent to each photodetector pair for electrically connecting the frontside and backside regions to one another.

5. The image capture device as in claim 4, wherein the back-illuminated image sensor further comprises a voltage terminal electrically connected to at least one frontside region of the second conductivity type for biasing the one or more frontside regions to a voltage.

6. The image capture device as in claim 4, wherein the first conductivity type comprises a p conductivity type and the second conductivity type comprises an n conductivity type.

* * * * *